United States Patent [19]

Staples

[11] Patent Number: 4,587,595
[45] Date of Patent: May 6, 1986

[54] HEAT SINK ARRANGEMENT WITH CLIP-ON PORTION

[75] Inventor: James F. Staples, Westford, Mass.

[73] Assignee: Digital Equipment Corporation, Maynard, Mass.

[21] Appl. No.: 529,839

[22] Filed: Sep. 6, 1983

[51] Int. Cl.⁴ .............................................. H05K 7/20
[52] U.S. Cl. .................................. 361/388; 165/185; 165/80.3; 174/16 HS
[58] Field of Search .................... 361/382–384, 361/386–388; 165/80 B, 185; 174/16 HS; 357/81

[56] References Cited

U.S. PATENT DOCUMENTS 3,519,889  7/1970  Monaco ............................... 361/388
3,916,435 10/1975  Camplin ............................. 165/80 B
4,345,267  8/1982  Corman .............................. 361/382

OTHER PUBLICATIONS

IBM Tech Discl Bull, vol. 20, No. 12, May 1978, p. 5203, Eckenbach, S–C Module with Heat Transfer.
IBM Tech Discl Bull, vol. 22, No. 3, Aug. 1979, p. 960, Demaine, Attachable Heat Sink for Pluggable Modules.
IBM Tech Discl Bull, vol. 23, No. 11, Apr. 1981, p. 4850, Kilburn, Means of Attaching Heat Sink to a Module.

Primary Examiner—G. P. Tolin
Attorney, Agent, or Firm—William E. Cleaver

[57] ABSTRACT

The present invention includes a heat sink device which, in a preferred embodiment, has a number of fins extending from a flat base section. In addition, there are matching grooves formed in a pair of said fins and snapped into said grooves, there is located a plastic clip-on member. The clip-on member is designed to be spread, or temporarily deformed at its ends, in order to be clipped onto a holder which is holding an active element (a heat generating element), such as an integrated circuit. When the clip-on member is so clipped onto the holder, it applies force to hold said flat base section of said heat sink means against the section of the holder which overlies the active element to thereby conduct heat from the active element. The clip-on member can be readily removed if, for instance, the integrated circuit fails and in this way the heat sink is not wasted.

7 Claims, 6 Drawing Figures

HEAT SINK ARRANGEMENT WITH CLIP-ON PORTION

BACKGROUND

It is well understood in the electronic art that integrated circuits, and the like, generate heat which, if not removed, will be in excess of their rated temperature values. Such heat must be conducted away since the life span of such circuits is closely related to operating such circuits below, or at, their rated temperature, but not in excess thereof. In the prior art, elaborate arrangements are in use to conduct heat from the active element (integrated circuit). One such example is found in U.S. Pat. No. 4,345,267. In U.S. Pat. No. 4,345,267, there are two circular fins mounted in the center on a substantially large stud. The stud, in turn, is mounted with a collar onto an elaborate base device. The base device is formed to have upwardly extending protrusions to hold the fin structure vertically at a good distance from the base. Another part of the base section is formed to have ears, or extensions, therefrom, and these extensions are forced under associated spring-loaded clips which are mounted on the integrated circuit holder. In this way, heat is conducted from the active element, through the base section, through the stud device, and therefrom through the fins to the ambient air. It would appear that such an arrangement conducts heat from an active element, but it's also apparent that such an arrangement is costly, bulky in size, and not an efficient heat conductor. Other devices of the prior art are also costly, bulky, and inefficient. In addition, some of the other arrangements do not lend themselves to be readily reused. The present device is not only a reusable, efficient heat conductor, but is a relatively inexpensive heat sink arrangement, which is relatively small in size.

SUMMARY

The present invention comprises a heat sink means fabricated from some material which readily conducts heat and, in the preferred embodiment, is fabricated from aluminum. Other materials could be used. The heat sink member is designed to be used with a holder means within which there is disposed an active element which generates heat. The heat sink member has a flat base section which is designed to come in contact with the section of the holder member that overlies the active element (the heat generating element) to conduct heat therefrom. In addition, a plurality of fins, formed integral with said flat base section, extend upwardly away from the base section. All of the heat conducted by the flat base section is readily (efficiently) dissipated through the fins. Between a pair of selected fins, there is formed a pair of matching grooves. A plastic clip-on means has the sides of its central section temporarily deformed and squeezed into said matching grooves. When the deformed sides are "released," they return to their normal position and the plastic clip-on device is secured within said matching grooves. The plastic clip-on device is designed to fit over two corners of the holder which holds the integrated circuit. The plastic clip-on device is further designed to slip over an "apex" edge of the integrated circuit holder. The "apex" edge lies opposite the edge which joins the corners over which the plastic clip-on device has been secured as mentioned above. The plastic clip-on device is made of resilient material and when it is clipped onto said "apex" edge, it is slightly deformed, but springs back to provide a secure grip on the "apex" edge. The plastic clip-on device has a protruding means secured to, or formed from, its lower side so that when the clip-on device is clipped onto the integrated circuit holder, said protruding means brings force against the flat section of the base of the heat sink member to hold said flat section in good contact with the section of the holder which overlies said active element.

The objects and features of the present invention will be better understood in view of the following description taken in conjunction with the drawings wherein.

Figure 1:
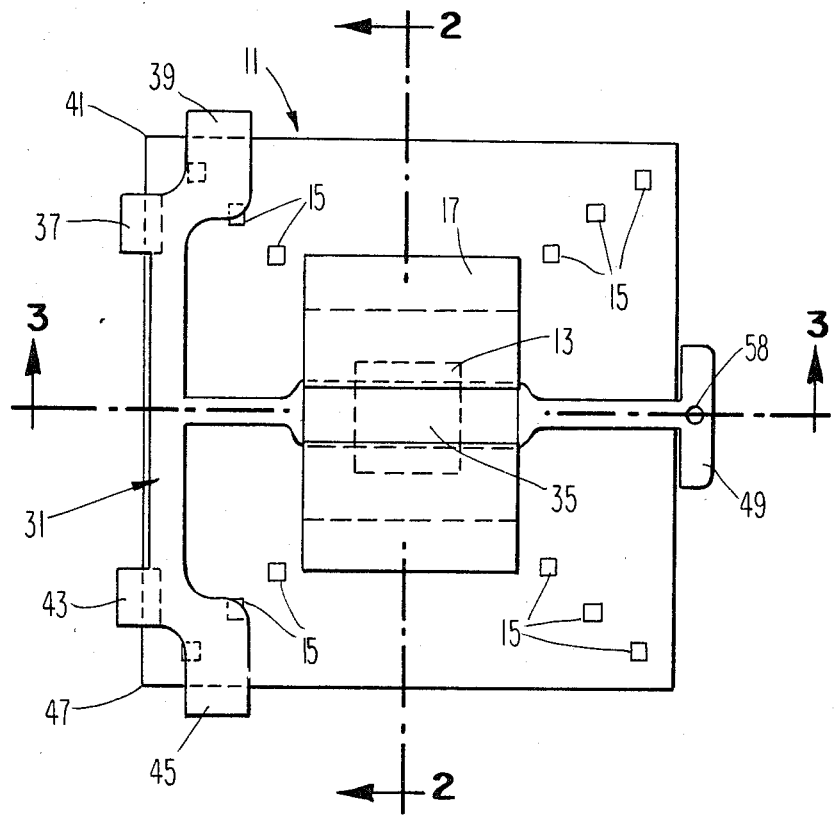
FIG. 1 is a top view of an integrated circuit holder with a heat sink and the plastic clip-on device secured thereto.
Figure 3:
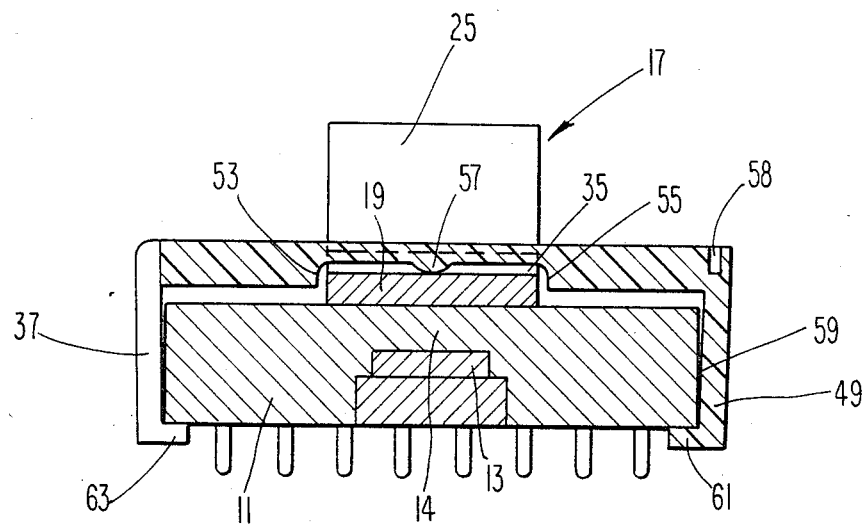
FIG. 3 is a cut-away lower-end view of FIG. 1.

Consider FIG. 1. In FIG. 1, there is shown a holder device 11 which is designed to hold an integrated circuit chip 13 in approximately the center thereof. As can be seen in FIG. 3, the integrated circuit 13 fits into a cavity within the holder 11 and the section 14 of the holder which overlies the integrated circuit is available for contact by the heat sink member 17. In FIG. 1 there is further shown the arrangement of the metalized tabs, as depicted by the squares 15. The tabs 15 are connected through a printed circuit arrangement, or some other suitable means, to the integrated circuit 13. Such techniques are well understood in the art and are not germane to the present invention.

Figure 2:
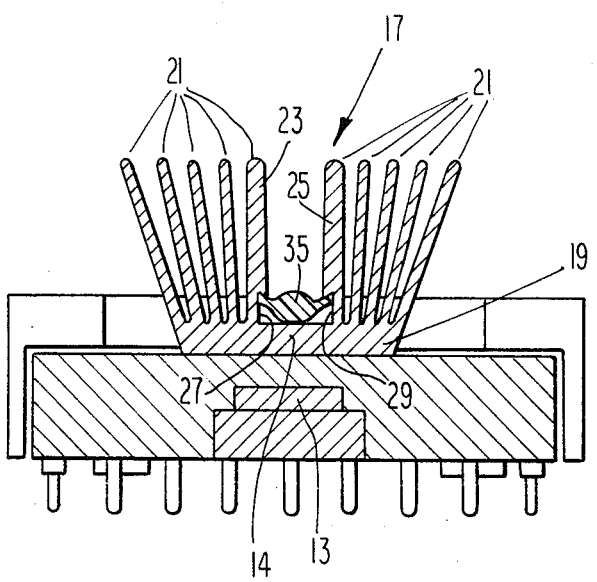
FIG. 2 is a cut-away side-end view of FIG. 1.

In FIG. 1, there is shown a heat sink means 17. The heat sink means 17 can be better appreciated from FIG. 2. In FIG. 2, the heat sink means is shown with the flat base section 19 and a plurality of fins 21. The fins 21 are formed integral with, or from the same bit of material as, the flat base section 19. In FIG. 2, it can be seen that the flat base section 19 comes in contact with the section 14 of the holder which overlies the integrated circuit 13. Accordingly, when the active element, or the integrated circuit 13, generates heat, as it does, the flat base section conducts that heat away from the integrated circuit through the section 14 of the holder which lies over the integrated circuit. The heat is passed up the fins 21 to be passed therefrom to the ambient air moving between the fins 21. If the circuit were housed in a package, some cooling gas could be passed between the fins.

Figure 6:
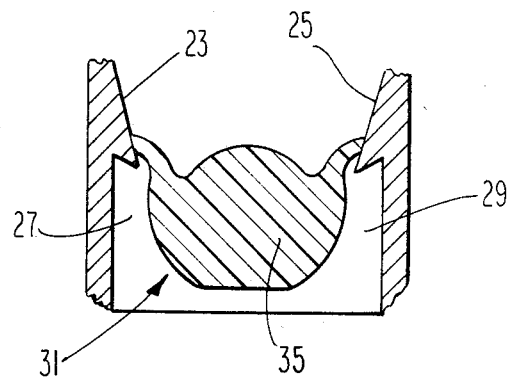
FIG. 6 depicts the clip-on bridging section being squeezed into the grooves.

Further in FIGS. 2 and 6, it can be seen that the two fins 23 and 25 each have a groove, respectively 27 and 29 formed therein. The matched grooves 27 and 29 are so formed that the plastic clip-on member 31 can have its bridging section 35 squeezed to be located within the grooves 27 and 29 as can be seen in FIG. 6. After the bridging section is so located, the squeezed, or deformed, sides of the bridging section are "released" and spring back to their normal position, thus locking the bridging section 35 within the grooves 27 and 29.

In FIG. 1, it can be seen that the plastic clip-on device has a pair of tabs 37 and 39 located at the corner 41 of the integrated circuit holder 11. In addition, as can also be seen in FIG. 1, the plastic clip-on device has a pair of tabs 43 and 45 which are located at to the corner 47 of the integrated circuit holder. The shape of the tabs can be better appreciated from FIG. 3 wherein the tab 37 is shown to be formed to have a section pass under the integrated circuit holder 11 and thus secure the plastic clip-on device to the integrated circuit holder 11. Tab 43 is similarly shaped and secures the lower left hand section of the clip-on member (as viewed in FIG. 1) to the holder 31. The tabs 39 and 45 do not have the under section just described to keep the clip-on member from moving up, but do have the hang down section which keeps the clip-on member from moving from side to side (upward and downward as viewed in FIG. 1). The tabs 37, 39, 43 and 45 are shaped so that when they are located, as shown in FIG. 1, they secure the plastic clip-on device in three directions. In other words, the plastic clip-on device cannot move toward the top or the bottom of the drawing, nor can it move to the right of the drawing because of the tabs being secured, as shown in FIGS. 2 and 3. On the right hand side (as viewed in FIG. 1) of the plastic clip-on device, there is a center, or apex, tab 49. By designing the plastic clip-on device 31 to form a triangle, the cost is reduced because the clip-on device need not be made with great precision. To say that another way, if there were tabs on all four corners and they did not fit precisely correctly, the clip-on device would not have its intended effect, which is to hold the heat sink means in place and, in particular, in abutment with the holder of the integrated circuit 13. The apex tab 49 is shaped as shown in FIG. 3 and clips under the integrated circuit holder 11 as shown.

Now it should be noted in FIG. 3 that the plastic clip-on device is also formed to have a well 51 which in turn has side walls 53 and 55. Hence, when the bridging section 35 of the plastic clip-on device 31 is secured between the fins 23 and 25, the flat base section 19 is held secure within the well 51, in particular by the side walls 53 and 55. This arrangement enables the heat sink means 17 to be located centrally over the section 14 of the holder which overlies integrated circuit 13. Also, as can be gleaned from FIG. 3, there is a protrusion 57 secured to, or formed from, the under side of the plastic clip-on device 31. Actually, the protrusion 57 is within the well 51. As can be readily seen from FIG. 3, when the plastic clip-on device 31 is fastened, or clipped, onto the holder 11, the protrusion 57 comes in contact with the flat section of the base 19 to force the flat section of the base 19 into meaningful contact with the section 14 of the holder which overlies integrated circuit 13. The protrusion 57 is formed in a semi-spherical configuration so that it comes in contact at one point with the flat base section 19. This design also enables the clip-on device to be made without great precision because there will be a point on the semi-spherical device that will come in contact with the base, whereas some other shape might defeat the purpose or require precision fabrication.

Accordingly, when the integrated circuit 13 is operative and is generating heat, heat will be conducted from the integrated circuit 13, through the section 14 of the holder which overlies the integrated circuit, through the flat base section 19 and up each of the fins 21. As air is passed between the fins 21, the air, of course, will absorb heat from the fins and, hence, the heat is conducted from the integrated circuit 13 as is the intended purpose. The fins 21 act as the dissipation section of the heat sink member and the heat is dissipated into the ambient material which, in the preferred embodiment, is air.

When the plastic clip-on member has been located between the fins 23 and 25, and is going to be locked on, or clipped on, to the integrated circuit holder 11, the tab 49 is bent counter clockwise as viewed in FIG. 3. In other words, there is a tool which is fitted into the aperture 58 and the tool is moved counter clockwise to bend the tab 49 outward to permit that tab to "get around" the edge 59 of the integrated circuit holder 11. When the tab 49 has cleared the edge 59, the plastic clip-on device is moved downward and the under section 61 of the tab 49 is permitted to slip under the integrated circuit holder 11 to be positioned as shown in FIG. 3.

Figure 4:
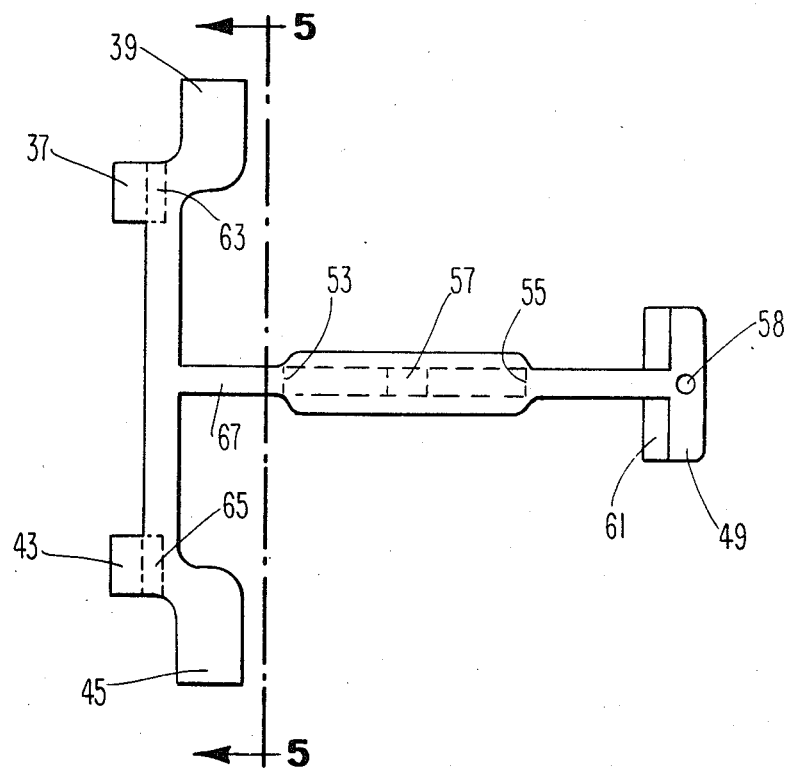
FIG. 4 is a top view of the plastic clip-on device per se.

FIG. 4 depicts the plastic clip-on device by itself. The same numerals that were used in FIGS. 1, 2 and 3 are used in FIG. 4. In FIG. 4, it can be seen that the tabs 39 and 45 do not come under the integrated circuit holder, but merely keep the integrated circuit holder from going upward or downward, as viewed from the drawing. In FIG. 4 the under section 65 is analogous to the under sections 61 and 63 shown in FIG. 3. In other words, the under sections 63 and 65 actually secure the plastic clip-on member to the integrated circuit holder 11. As can be further appreciated in FIG. 4, the side walls 53 and 55 of the well 51 are formed to hold the heat sink means in place when the plastic clip-on member is assembled with the heat sink means 17. As also can be seen in FIG. 4, the protrusion 57 is located virtually in the center of the well 51.

Figure 5:
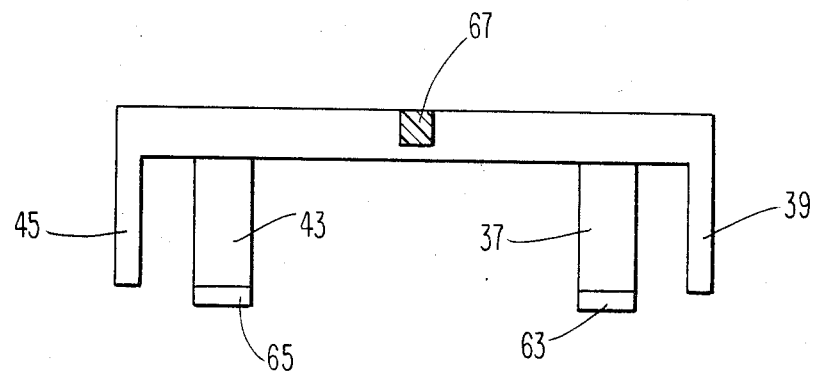
FIG. 5 is a side-end view of the device of FIG. 4.

In FIG. 5, which is the end view of the plastic clip-on member without the tab 49, the same numerals depict the same elements. It is clear from the view of FIG. 5 that the tabs 39 and 45 do not have any under sections. The cut-through 67 of the bridging section 35 is shown in FIG. 5 to get an appreciation of the simplicity of the plastic clip-on member.

The present invention provides a number of advantages over the prior art. First of all, the arrangement of the heat sink member provides an efficient heat conduction apparatus. The flat base section 19 provides the maximum amount of contact with the section of the holder which overlies the integrated circuit 13, which is the source of the heat. Because there is additional base material on both sides of the integrated circuit element, there is a reduced heat density in the flat base section 19. Also, the fact that the fins 21 are formed integral with that flat base section 19, permits the heat to be conducted immediately up the fins and dissipated therefrom into the ambient air. A number of the prior art devices, (which, indeed, provide means for conducting heat from the integrated circuit), are arranged to have the heat conducted through a narrow channel, such as a stud, before getting to any kind of a fin arrangement, and such heat density detracts from the efficiency of the device. A second feature of the present invention, which makes it more desirable than the devices of the prior art, is the simplicity of the plastic clip-on device. As suggested earlier, the plastic clip-on device is made in triangular form and is only secured to the under side of the integrated circuit holder in three locations. Accordingly, the plastic clip-on member can be mass produced, at a very low price and can be literally a "throwaway item" in the event that it breaks in the clip-on assembly or it breaks in the removal. The amount of time required to assemble the plastic clip-on device with the heat sinks is minimal. The user need only squeeze the walls of the bridging section into the grooves of the fins 23 and 25, as described above and as shown in FIGS. 2 and 6. Before the plastic clip-on member can be fully seated, the heat sink member must be fitted into the well 51, as shown in FIG. 3 and now the two-piece assembly is ready for attachment to the integrated circuit holder 11. The assembly just described is obviously not bulky. There are no elaborate circular fins with covers wherein the price of the heat assembly device approaches that of the holder and the intergated circuit, as is true in the prior art. In the event that the integrated circuit should fail, the present assembly can be quickly removed by inserting the proper tool into the aperture 58, bending the tab 49 in a counter clockwise direction, and slipping the plastic clip-on device from the integrated circuit holder 11, which action will remove the heat sink member 17 because of the assembly of the plastic clip-on device with the heat sink means. Accordingly, the heat sink means can be readily used again and in the event that the plastic clip-on device is broken, it can be readily replaced, or in the event that it is not broken, it can be reused again. In the prior art, if the heat sink mechanism is to be reused, a great deal of time has to be consumed. In some situations where the heat sink system, or heat sink device, is such an integral part of the overall package, it is impossible to reuse the heat sink means.

I claim:

1. A clip-on heat sink arrangement conducting heat from an element which generates heat and which element is held in a holder means having a plurality of edges and which holder means has a heat transfer section which overlies said element, comprising in combination: heat sink means formed of material which readily conducts heat, said heat sink means having, (1) a contact section means to come in substantial contact with said heat transfer section of said holder and (2) a heat dissipating section formed to pass heat to ambient air, said dissipating section further having means for securing a clip-on means thereto; a clip-on means having an underside and (1) being resilient and (2) having a plurality of clip-on tab means which are formed and disposed to fit around certain sections of said edges of said holder means; protruding means disposed on said underside of said clip-on means; and said clip-on means secured by said means for securing to said heat dissipating section, whereby when said tabs of said clip-on means are fitted around said certain sections of said edges of said holder means, said protruding means provides pressure against said contact section to cause it to come into substantial contact with said heat transfer section of said holder in order to conduct heat from said element.

2. A clip-on heat sink arrangement according to claim 1 wherein said contact section means is a flat section of the base of said heat sink means and wherein said heat dissipating section comprises a plurality of fins which are formed integral with said flat base section and rise therefrom.

3. A clip-on heat sink arrangement according to claim 2 wherein said means for securing includes two of said fins each of which has a groove therein and wherein said grooves are disposed so that said clip-on means can be squeezed to fit within said grooves.

4. A clip-on heat sink arrangement according to claim 1 wherein certain of said clip-on tab means each have a section which lies in abutment with the underside of said holder means when said clip-on means is clipped onto said holder means.

5. A clip-on heat sink arrangement according to claim 1 wherein said contact section means has edges and wherein said clip-on means has a well-like structure with side walls formed approximately in the center of said clip-on means and wherein said side walls fit over the edges of said contact section when said heat sink means secures said clip-on means.

6. A clip-on heat sink arrangement according to claim 1 wherein three of said clip-on tab means each have a section which fits into abutment with the underside of said holder means and wherein said three clip-on tab means, when viewed together, form a triangle having an apex clip-on tab with two of said clip-on tabs being secured to one edge of said holder means and the apex clip-on tab means being secured to an edge of said holder means lying opposite said last mentioned one edge.

7. A heat sink arrangement according to claim 1 wherein one of said tab means has an aperture therein whereby a tool can be fitted into said aperture to bend said tab outwardly in order to permit said clip-on means to be clipped onto said holder means.

* * * * *